US012800655B2

(12) United States Patent
Cioranesco et al.

(10) Patent No.: US 12,800,655 B2
(45) Date of Patent: Nov. 17, 2026

(54) DEVICE UNDER TEST, FAULT INJECTION TESTING SYSTEM AND METHOD FOR FAULT INJECTION TESTING USING AN ON-CHIP FAULT TESTING MODULE

(71) Applicant: NXP B.V., Eindhoven (NL)

(72) Inventors: Jean-Michel Cioranesco, Schenefeld (DE); Oliver Diehl, Hannover (DE); Volodymyr Bezsmertnyi, Lübeck (DE)

(73) Assignee: NXP B.V., Eindhoven (NL)

( * ) Notice: Subject to any disclaimer, the term of this patent is extended or adjusted under 35 U.S.C. 154(b) by 413 days.

(21) Appl. No.: 18/545,546

(22) Filed: Dec. 19, 2023

(65) Prior Publication Data

US 2025/0199065 A1 Jun. 19, 2025

(51) Int. Cl.
*G01R 31/317* (2006.01)

(52) U.S. Cl.
CPC . *G01R 31/31705* (2013.01); *G01R 31/31718* (2013.01)

(58) Field of Classification Search
CPC ........ G01R 31/31705; G01R 31/31718; G06F 11/3656
See application file for complete search history.

(56) References Cited

U.S. PATENT DOCUMENTS

2010/0287535 A1 11/2010 Kim et al.
2014/0019818 A1* 1/2014 Jindal ................. G06F 11/2215 714/724
2019/0361073 A1* 11/2019 Trantham ............ G06F 11/3656

FOREIGN PATENT DOCUMENTS

CN 104700044 A * 6/2015

OTHER PUBLICATIONS

CN-104700044-A_translated (Year: 2015).*
Fidalgo, André et al. "Using NEXUS Compliant Debuggers for Real Time Fault Injection on Microprocessors." Proceedings of the 19th Annual Symposium on Integrated Circuits and Systems Design. New York, NY, USA: ACM, 2006. 214-219. Web. (Year: 2006).*
Fidalgo, André et al.; "Using NEXUS Compliant Debuggers for Real Time Fault Injection on Microprocessors"; SBCCI '06: Proceedings of the 19th Annual Symposium on Integrated Circuits and Systems Design, Ouro Preto MG Brazil; Published Aug. 28, 2006; pp. 214-219; https://doi.org/10.1145/1150343.1150397.
Portela-García, Marta et al. "Fault Injection in Modern Microprocessors Using On-Chip Debugging Infrastructures", IEEE Transactions on Dependable and Secure Computing, vol. 8, No. 2, Mar.-Apr. 2011, pp. 308-314.
Reorda, M. Sonza et al. "Fault Injection-based Reliability Evaluation of SoPCs", Proceedings of the Eleventh IEEE European Test Symposium (ETS'06), 2006, 6 pgs.

* cited by examiner

*Primary Examiner* — Catherine T. Rastovski
*Assistant Examiner* — Michael J Singletary

(57) ABSTRACT

There is provided, in one embodiment, a device under test, fault injection (FI) testing system and method for FI testing that uses an on-device FI module operable to execute FI testing on a processor core on the device under test through a debug module. The device under test includes a debug port designed to receive external protocol-specific debug signals and a debug transport module connected to the debug port. The debug module is connected to the debug transport module to receive the core-specific debug signals.

20 Claims, 5 Drawing Sheets

DEVICE UNDER TEST, FAULT INJECTION TESTING SYSTEM AND METHOD FOR FAULT INJECTION TESTING USING AN ON-CHIP FAULT TESTING MODULE

BACKGROUND

Fault injection simulation is a testing technique used in software and hardware development to evaluate how a target system behaves when subjected to errors. The technique involves intentionally injecting faults or errors into the target system to assess its robustness, reliability, and fault tolerance. However, fault injection simulation on a full system with peripherals and cycle accuracy is difficult to achieve, and thus, results in less realistic testing (e.g., simulating interrupt mechanisms).

Fault injection emulation through debugger on hardware may be used to achieve better results. However, using such a debugger is also not ideal due to a typically slow connection and many communication cycles. Additionally, complex fault modelling impacts negatively on testing time since parameter search space increases exponentially for various fault types, such as memory corruption, or multiple instruction skips and wrong branching.

SUMMARY

Device under test, fault injection (FI) testing system and method for FI testing uses an on-device FI module operable to execute FI testing on a processor core on the device under test through a debug module. The device under test includes a debug port designed to receive external protocol-specific debug signals and a debug transport module connected to the debug port. The debug module is connected to the debug transport module to receive the core-specific debug signals.

In an embodiment, a device under test comprises a debug port designed to receive external protocol-specific debug signals, a debug transport module connected to the debug port, the debug transport module being operable to translate protocol-specific debug signals into core-specific debug signals, a debug module connected to the debug transport module to receive the core-specific debug signals, a processor core operatively connected to the debug module, and an on-device FI module operable to execute FI testing on the processor core through the debug module.

In an embodiment, the FI testing system further comprises a multiplexer connected to the debug port and the on-device FI module to selectively connect one of the debug port and the on-device FI module to the debug transport module to access the processor core.

In an embodiment, the on-device FI module is operable to generate internal protocol-specific serial debug signals to be translated into the core-specific debug signals to control the debug module for the FI testing.

In an embodiment, the FI testing system further comprises a multiplexer connected to the debug transport module and the on-device FI module to selectively connect the debug transport module or the on-device FI module to the debug module to access the processor core, wherein the multiplexer is controlled by the on-device FI module.

In an embodiment, the on-device FI module is operable to generate particular core-specific debug signals to control the debug module for the FI testing.

In an embodiment, the on-device FI module is operable to generate testing-related signals to execute steps of the FI testing for each fault address being tested by the on-device FI module.

In an embodiment, the on-device FI module is operable to inject a fault when a breakpoint at a fault address is triggered to determine whether a breakpoint is triggered at a positive or negative path address, wherein the positive path address is an address where an execution is supposed to go in case of a fault injection attack and the negative path address is an address wherein the execution is not supposed to go in case of a fault injection attack.

In an embodiment, the on-device FI module is operable to compare contents of memory or registers when a breakpoint is triggered at a particular positive path address or for timeouts.

In an embodiment, a method for performing FI testing on a device under test (DUT) comprises configuring an on-device FI module on the DUT from a host computer connected to the on-device FI module without using a debug port of the DUT, generating testing-related signals to execute steps of the FI testing for each fault address being tested by the on-device FI module, transmitting the testing-related signals to a processor core on the DUT from the on-device FI module through a debug module on the DUT, generating a report for all the fault addresses tested at the on-device FI module, and downloading the report from the on-device FI module to the host computer for analysis.

In an embodiment, the method further comprises connecting the on-device FI module to a debug transport module on the DUT through a multiplexer on the DUT to transmit internal protocol-specific serial debug signals generated by the on-device FI module to the debug module for the FI testing.

In an embodiment, the method of claim further comprises connecting the on-device FI module to the debug module through a multiplexer to transmit testing-related core-specific debug signals generated by the on-device FI module to control the debug module for the FI testing.

In an embodiment, the transmitting the testing-related signals to the processor core on-device FI module includes injecting a fault when a breakpoint at a fault address is triggered to determine whether a breakpoint is triggered at a positive or negative path address, wherein the positive path address is an address where an execution is supposed to go in case of a fault injection attack and the negative path address is an address wherein the execution is not supposed to go in case of a fault injection attack.

In an embodiment, the method of claim further comprises comparing contents of memory or registers when a breakpoint is triggered at a particular positive path address or for timeouts.

In an embodiment, an FI testing system comprises a host computer including a debugger and an FI testing manager, and a device under test comprising a debug port designed to receive external protocol-specific debug signals managed by the debugger, a debug transport module connected to the debug port, the debug transport module being operable to translate protocol-specific debug signals into core-specific debug signals, a debug module connected to the debug transport module to receive the core-specific debug signals, a processor core operatively connected to the debug module, and an on-device FI module operable to execute FI testing on the processor core through the debug module, the on-device FI module being directly connected to the FI testing manager to receive signals from the FI testing manager.

In an embodiment, the FI testing system further comprises a multiplexer connected to the debug port and the on-device FI module to selectively connect one of the debug port and the on-device FI module to the debug transport module to access the processor core.

In an embodiment, the on-device FI module is operable to generate internal protocol-specific serial debug signals to be translated into the core-specific debug signals to control the debug module for the FI testing.

In an embodiment, the FI testing system further comprises a multiplexer connected to the debug transport module and the on-device FI module to selectively connect the debugger or the on-device FI module to the debug module to access the processor core, wherein the multiplexer is controlled by the on-device FI module.

In an embodiment, the on-device FI module is operable to generate particular core-specific debug signals to control the debug module for the FI testing.

In an embodiment, the on-device FI module is operable to generate testing-related signals to execute steps of the FI testing for each fault address being tested by the on-device FI module.

In an embodiment, the on-device FI module is operable to inject a fault when a breakpoint at a fault address is triggered to determine whether a breakpoint is triggered at a positive or negative path address, wherein the positive path address is an address where an execution is supposed to go in case of a fault injection attack and the negative path address is an address wherein the execution is not supposed to go in case of a fault injection attack.

These and other aspects in accordance with embodiments will become apparent from the following detailed description, taken in conjunction with the accompanying drawings, illustrated by way of example of the principles of the embodiments.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended Figs. could be arranged and designed in a wide variety of different configurations. Thus, the following more detailed description of various embodiments, as represented in the Figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the embodiments is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
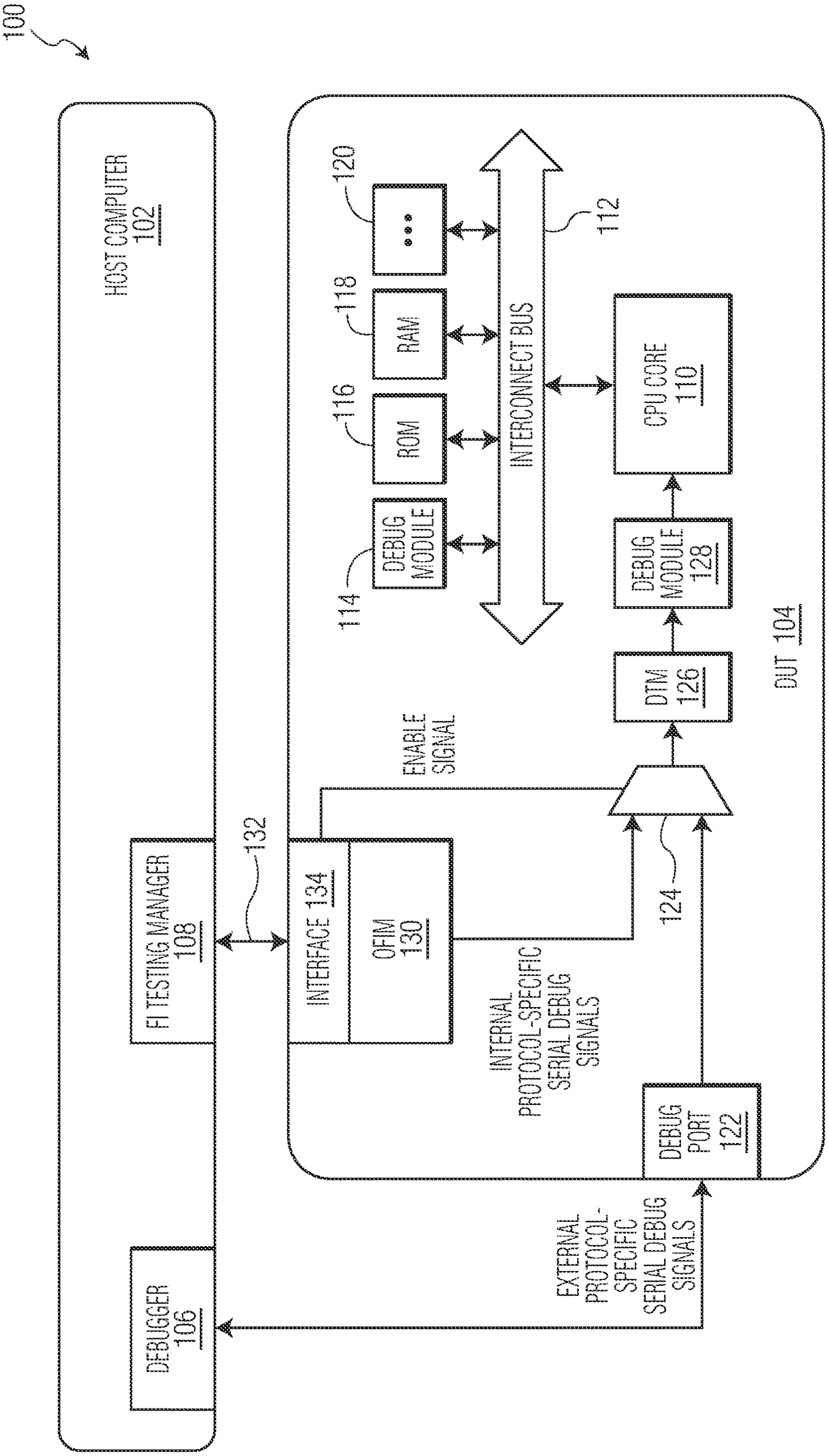
FIG. 1 is a block diagram of a testing system in accordance with an embodiment of the invention.

Turning now to FIG. 1, a testing system 100 in accordance with an embodiment of the invention is shown. The testing system 100 includes a host computer 102 and a DUT 104. The host computer 102 may be any computer system, such as a personal computer. The host computer includes a debugger 106 and an FI testing manager 108, which may be programs running on the host computer. The debugger 106 operates to debug one or more programs running on the DUT using one or more debugging algorithms. The debugger may be any well-known debugger commonly used to debug software programs in DUTs, such as the DUT 104. The FI testing manager 108 operates to manage FI testing runs executed within the DUT, as described in detail below.

As shown in FIG. 1, the DUT 104 includes a central processing unit (CPU) core 110 and a number of peripheral components connected to an interconnect bus 112. These peripheral components include a debug read-only memory (ROM) 114, a ROM 116, random access memory (RAM) 118 and other components 120 commonly found in a computing system. The CPU core 110 may include various components commonly found in a processor core, such as a control unit (CU), an arithmetic logic unit (ALU) and registers, e.g., general purpose registers (GPRs) and control and status registers (CSRs). As an example, the CPU core 110 may be an Advanced Reduced Instruction Set Computing (RISC) machine (ARM) core. The CPU core may further include data and instruction interfaces to transmit various information between the CPU core and the peripheral components.

The DUT 104 further includes a debug port 122, which allows the debugger 106 in the host computer to access the CPU core 110 via a multiplexer 124, a debug transport module (DTM) 126 and debug module 128. The DUT also includes an on-device fault injection module (OFIM) 130 that can execute FI testing on the CPU core 110 via the multiplexer, the DTM and the debug module.

The debug module 128 is a core-specific hardware component that operates to assist in debugging and testing the CPU core 110. The debug module can perform tasks, such as halting the core's execution, inspecting registers and memory, setting breakpoints and tracing program execution. The DTM 126 operates to convert or translate protocol-specific serial debug signals (e.g., Joint Test Action Group (JTAG) signals) into core-specific debug signals (e.g., Debug Module Interface (DMI) signals) for the debug module 128. The protocol-specific serial debug signals may originate from the debugger 106 as external signals or from the OFIM 130 as internal signal, which are selectively transmitted to the DTM 126 through the multiplexer 124. The multiplexer 124 is controlled by the OFIM 130. In an embodiment, the debugger 106 may be used as a debug controller to control the debugging and testing of the CPU core 110.

The OFIM 130 operates to automatically execute a test binary and inject different faults at different locations. These faults are software faults and, hence, are restricted to programmer's model and can be induced using debugging capabilities, which include data and instruction flow modifications, and exclude direct faulting of internal registers (Register Transfer Level-RTL, non-observable by software). The emulated faults are injected while the CPU core 110 is halted, which can happen due to a triggered breakpoint at a desired location within the test binary. Thus, the injection mechanism of the OFIM requires an access to basic debugging capabilities using the debug module 128. In particular, the OFIM 130 may be designed to:

(a) Set/clear a hardware breakpoint;
(b) Halt/resume the CPU core;
(c) Reset and halt the CPU core; and
(d) Read/write memory, GPRs, and CSRs.

Using the OFIM 130, a security analyst can efficiently test the behavior of the embedded software in the presence of different types of faults. The OFIM provides an automation of fault injection at different locations within a binary. The locations (i.e., instruction addresses) and the type of injected faults are specified by the user in advance.

In an embodiment, the FI testing manager 108 located on the host computer 102 operates to configure the OFIM 130 over a communication channel 132, which may be a dedicated high speed serial communication channel, such as a Serial Peripheral Interface (SPI) bus. Thus, the OFIM 130 includes an interface 134 to connect to the FI testing manager 108 via the communication channel 132. The communication interface and protocol between the host computer and the OFIM can vary. The configuration of the OFIM 130 may include sending over data that includes, but not limited to, (1) a fault address list, (2) positive path addresses, (3) negative path addresses, and (4) a timeout parameter, and (5) expected memory and register content. The fault address list is a list with instruction addresses, a.k.a. fault locations and a fault type per fault location. The user would need to manually analyze the tested code for potential fault injection locations and retrieve the addresses from the binary. The positive path addresses include a list of addresses where the execution is supposed to go in case of a fault injection attack, which means that no vulnerability is detected if one of the positive addresses is reached. The negative path addresses include a list of addresses where the execution is not supposed to go in case of a fault injection attack, which means that a vulnerability is discovered if one of the negative addresses is reached. The timeout parameter is the amount of time (e.g., in cycles or seconds) the OFIM will wait for the breakpoints at positive and negative addresses to trigger. The expected memory and register content is an optional configuration in which a user can specify what values certain portions of memory and GPRs may contain after a successful fault injection.

Once the OFIM 130 has been configured, the FI testing manager 108 sends a "start signal" after which the OFIM automatically performs execution and fault injection of the software under test. After the tests are performed, the FI testing manager downloads the results of the fault injection campaign and provides them to the user for further investigations.

As described above, the OFIM 130 receives the configuration data over the communication channel 132 and stores the data internally. For each address in a fault address list, the OFIM performs the following actions using the debug access port of the CPU core 110:

a. Reset and halt the CPU core in order to perform a clean run without artifacts from previous runs.
b. Prepare the OFIM owned timer in order to detect stalling behavior.
c. Set breakpoints at provided fault address, negative and positive paths.
d. Resume the core to kick off the code execution.
e. Eventually, the execution triggers a breakpoint at a fault address. When this occurs, the OFIM injects a fault according to the configured fault type for this particular address.
f. At some point, the execution triggers a breakpoint at a negative path. When this occurs, the OFIM saves the current fault address and prepares for the report.
g. The execution can also trigger a breakpoint at a positive path. If reference values for memory and GPRs are configured, the OFIM reads out the contents of memory portion and GPRs and saves the current fault address if reference values differ from the actual.
h. If no breakpoint at positive or negative paths are triggered after configured timeout, the OFIM aborts the run and saves the current fault address for the report. If reference values for memory and GPRs are configured, the OFIM reads out the contents of memory portion and GPRs and saves the current fault address if reference values differ from the actual.

After all the addresses in the fault address list have been tested, a campaign report is prepared by the OFIM for download.

Figure 2:
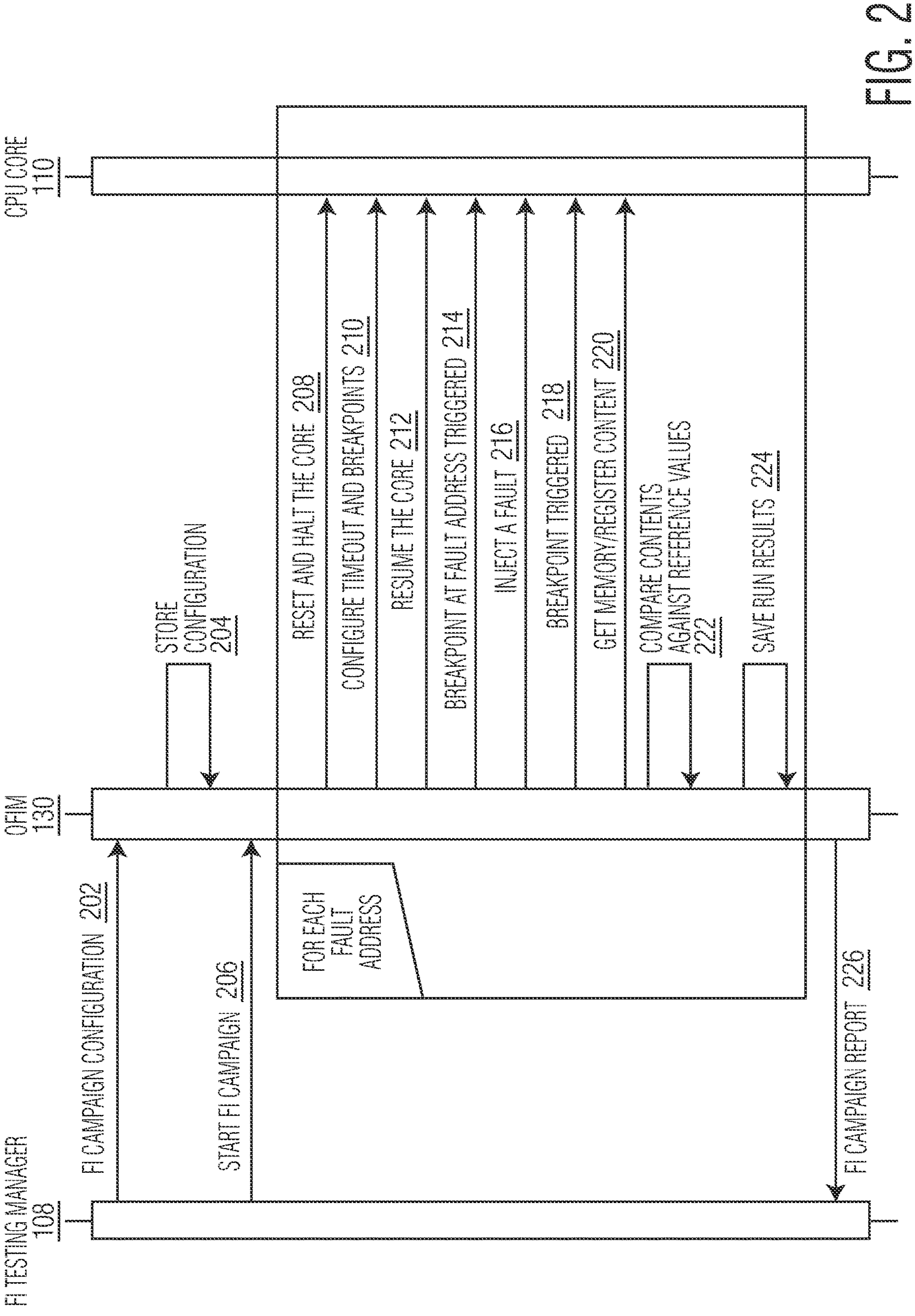
FIG. 2 is a sequence diagram of an FI testing process in accordance with an embodiment of the invention.

Turning now to FIG. 2, a sequence diagram of an FI testing process in accordance with an embodiment of the invention is shown. The FI testing process begins at step 202, where an FI campaign configuration data is sent to the OFIM 130 from the FI testing manager 108 in the host computer 102 via the communication channel 132. Next, at step 204, the FI campaign configuration data is stored internally by the OFIM 130. The OFIM is now ready to perform FI testing.

Next, at step 206, a start signal is transmitted to the OFIM 130 from the FI testing manager 108 to start the FI campaign. In response to the start signal, the OFIM performs steps 208-224 for each fault address.

At step 208, the CPU core 110 is reset and halted by the OFIM 130. Next, at step 210, timeout and breakpoints are configured in the CPU core 110 by the OFIM. Next, at step 212, the CPU core is resumed by the OFIM. Next, at step 214, a breakpoint at the fault address in the CPU core is triggered by the CPU core, which is detected by the OFIM Next, at step 216, a fault is injected in the CPU core by the OFIM.

In response to the fault injection, a breakpoint is triggered in the CPU core 110, at step 218, which is detected by the OFIM 130. Next, at step 220, memory/register contents are retrieved from the CPU core by the OFIM. Next, at step 222, the retrieved contents are compared to reference values by the OFIM. Next, at step 224, the results of the run are saved by the OFIM, which will be used to produce the FI campaign report.

After all the fault addresses have been tested, an FI campaign report is downloaded from the OFIM 130 by the FI testing manager 108, at step 226, which completes the FI testing process.

Figure 3:
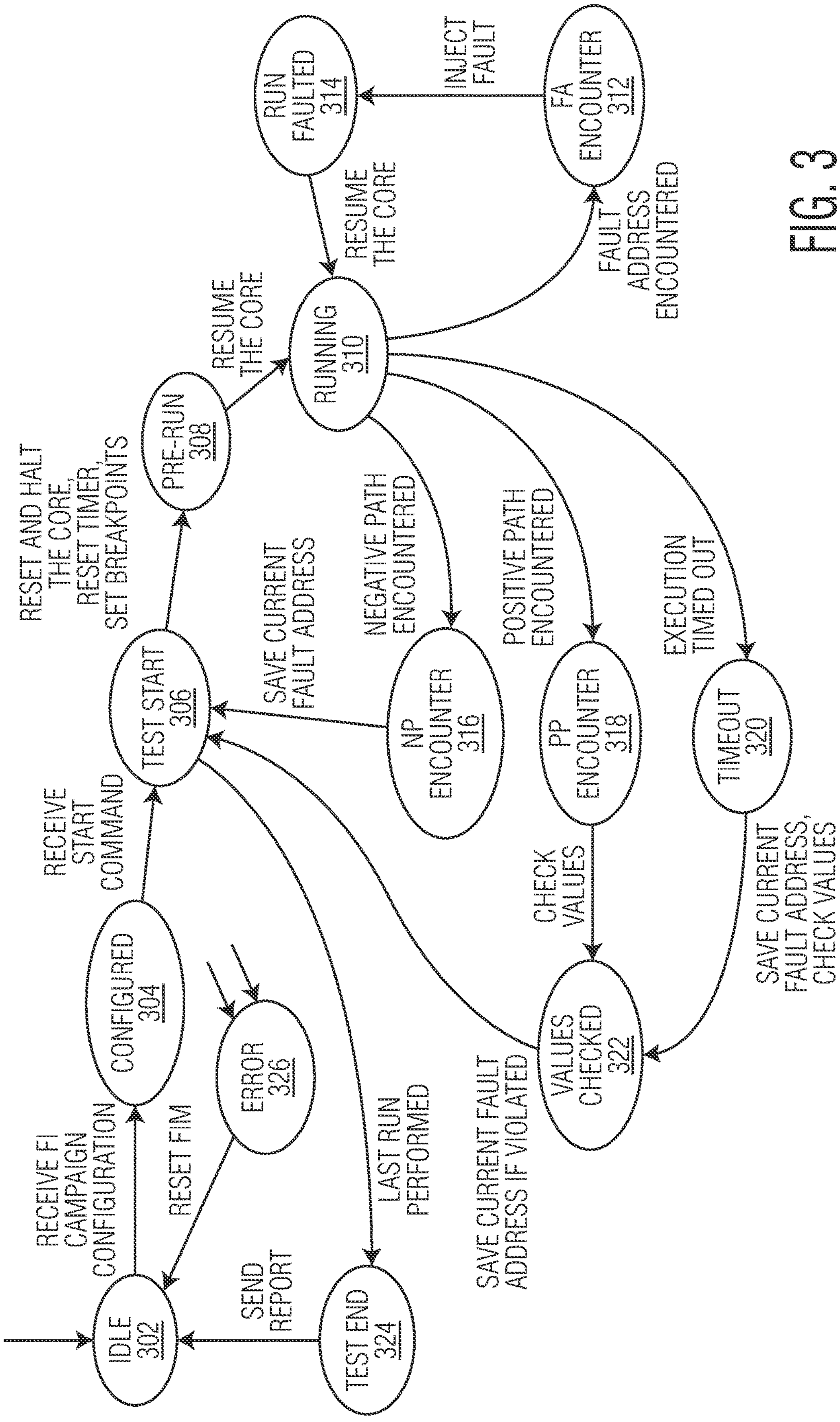
FIG. 3 is a block diagram of an abstract state diagram of an on-device fault injection module in the testing system in accordance with an embodiment of the invention.

Turning now to FIG. 3, an abstract state diagram of the OFIM in accordance with an embodiment of the invention is shown. This diagram is not complete and does not handle all possible events which could disrupt the FI campaign. Thus, a general error state is introduced for unhandled transitions.

As shown in FIG. 3, the states of the OFIM 130 includes IDLE 302, CONFIGURED 304, TEST START 306, PRE-RUN 308, RUNNING 310, FA ENCOUNTER 312, RUN FAULTED 314, NP ENCOUNTER 316, PP ENCOUNTER 318, TIMEOUT 320, VALUES CHECKED 322, TEST ENDED 324 and ERROR 326. The IDLE state 302 is the state at which the hardware is ready to receive the configuration data using a custom protocol and some communication channel, e.g., an SPI channel. The CONFIGURED state 304 is the state to which the OFIM is transitioned when all the necessary testing parameters (i.e., FI campaign configuration data) are provided to the OFIM. This state also expects a "start signal" to begin the testing. The TEST START state 306 is the state at which the run can be prepared and executed after a "start signal" is received. In this state, the core is reset and halted, the time is reset and breakpoints are set. The PRE-RUN state 308 is the state at which the run is ready to be started and the CPU core 110 can be resumed. The RUNNING state 310 is the state at which the OFIM needs to implement the ability to detect, if the CPU core is running or halted. If the core is halted, it can be due to breakpoints that were previously set. Depending on the halt reason, the state decides the next transition.

The FA ENCOUNTER state 312 is the state when a fault location is encountered. While the core is executing the code, the core will eventually encounter a fault location. At this point, the CPU core 110 is halted and a fault can be injected. The RUN FAULTED state 314 is the state at which the fault has been injected and the execution can be continued. The NP ENCOUNTER state 316 is the state at which a negative path has been executed, which means that a vulnerability has been discovered and the current fault address needs to be stored for the report. The PP ENCOUNTER state 318 is the state at which a positive path has been triggered by a breakpoint, which means that the program behaved as expected. Thus, the OFIM 130 needs to examine the contents of the memory and GPRs. The TIMEOUT state 320 is the state at which neither a positive or negative path has been executed, and an internal OFIM counter/timer has expired. At this state, the contents of the memory and/or GPRs can be verified. The VALUES CHECKED state 322 is the state at which the contents of the memory and/or GPRs have been compared to the reference value. Thus, the current fault address should be saved in case of a deviation in the contents, and the campaign can continue with the next test run. The TEST END state 324 is the state at which the FI campaign has been executed, and the user can download the results. The ERROR state 326 is the state to which any unhandled event at one of the other state is transitioned, as represented by the open-ended arrows in FIG. 3 as inputs to the ERROR state. In order to restart the campaign, the OFIM can be reset.

There are two ways the OFIM 130 can be connected to the debug module 128 in order to control the CPU core 110 for fault injection testing. The first option involves connecting the OFIM to the DTM 126 directly via the multiplexer 124 and using a unified debug protocol, such as JTAG, as illustrated in FIG. 1. The second option involves connecting the OFIM directly to the core-specific debug module 128 via the multiplexer 124, as illustrated in FIG. 4.

With respect to the first option, the OFIM 130 is directly connected to the DTM 126, which converts protocol-specific serial debug signals (e.g., JTAG) generated by the OFIM into core-specific debug signals, as shown in FIG. 1. In this embodiment, the OFIM acts as a debug controller, similar to a typical debugger. Using the multiplexer 124, the OFIM can control whether the OFIM or the debugger 106 can control the CPU core 110.

Using this approach, a standardized protocol can be used to control the CPU core 110, which increases the portability of the OFIM 130 since few changes are required to deploy the OFIM for different DUTs. In addition, connecting the OFIM to the DTM 126 is less invasive because the OFIM only uses public interfaces of the debug components. Furthermore, this approach can be applied to closed core developments (e.g., ARM cores). However, the use of the DTM reduces the debug performance because the DTM has to translate the protocol-specific debug commands into the core-specific signals, also because the transport protocol used to communicate to the debug module 128 is often times slower than counterparts (e.g., SPI>JTAG).

Figure 4:
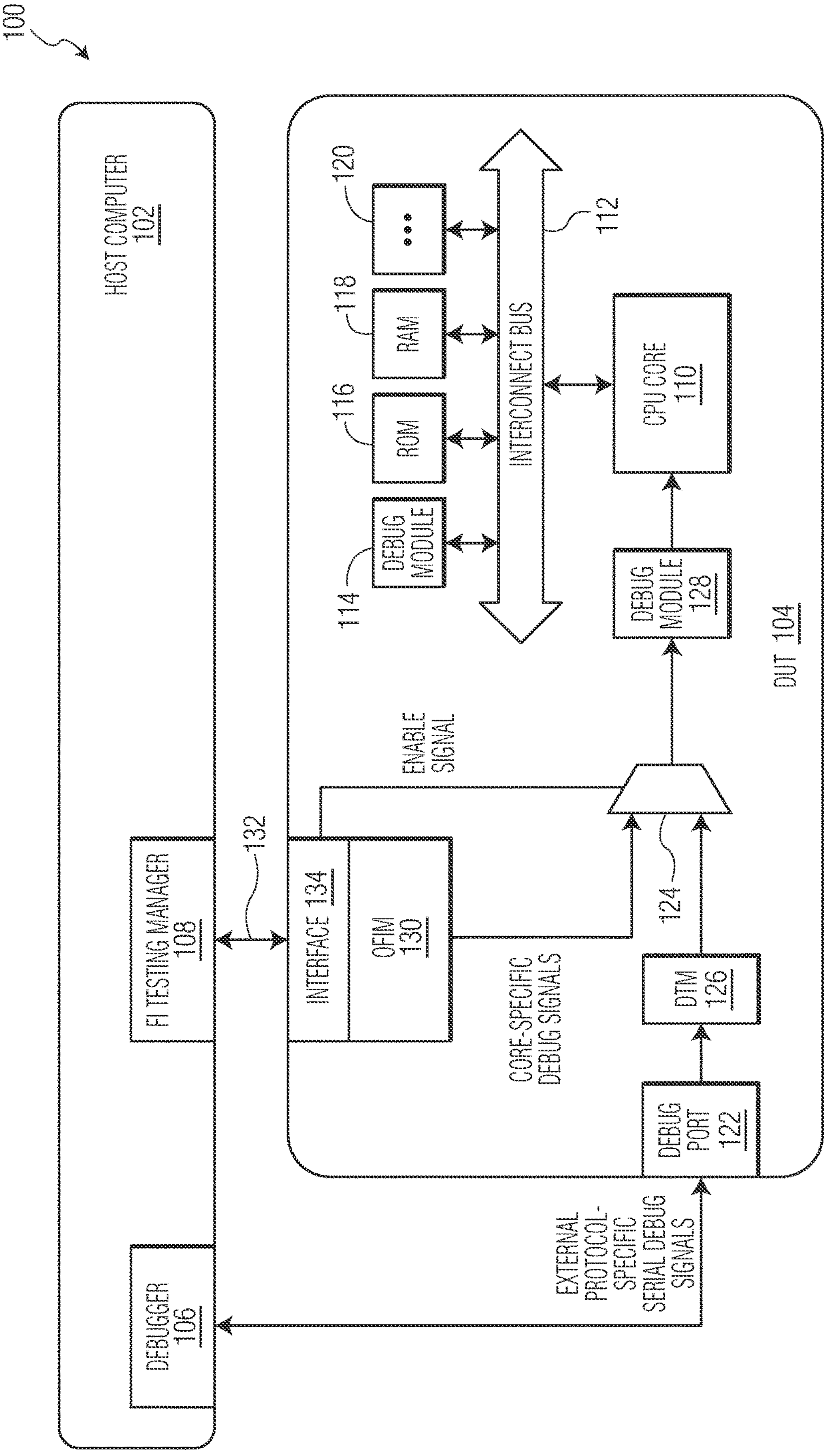
FIG. 4 is a block diagram of a testing system in accordance with another embodiment of the invention.

With respect to the second option, the OFIM 130 is attached to the debug module 128 directly and has the same capabilities as the DTM 126, as illustrated in FIG. 4. In this embodiment, the OFIM can convert the commands coming from the FI testing manager 108 in the host computer 102 via the high speed interface 132 to the core-specific debug signals directly. Using the multiplexer 124, the OFIM can control whether the OFIM or the debugger 106 can control the CPU core 110.

An advantage of this approach is that it is significantly faster because the DTM 126 is not involved. However, this option is only available if the DTM and the debug module 128 can be decoupled (e.g., RISC-V architecture). In addition, this approach is less portable as the OFIM 130 uses one or more internal interfaces of the debug module which may differ for different architectures. Furthermore, this approach is more invasive as the OFIM accesses the internal interfaces of the debug module.

Figure 5:
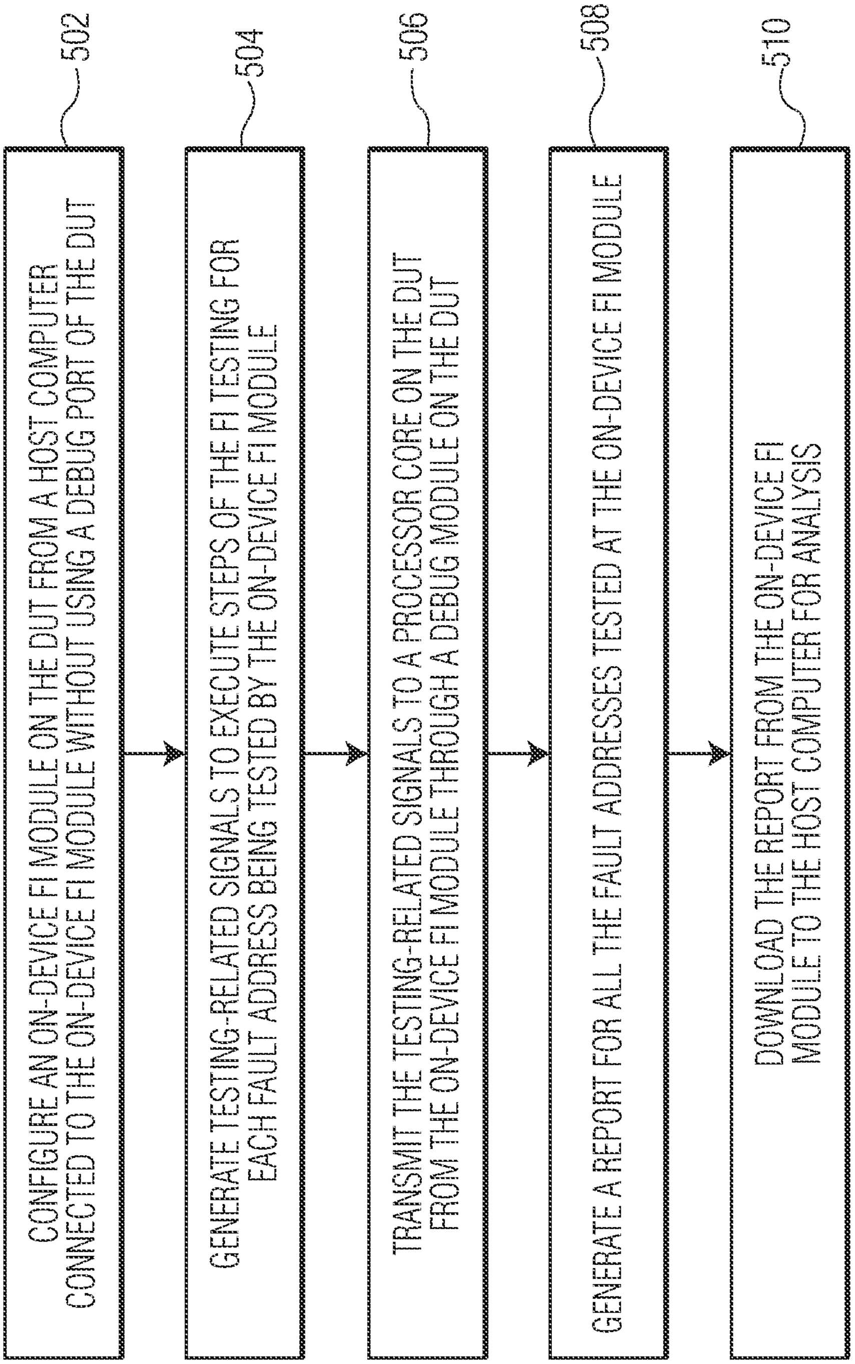
FIG. 5 is a process flow diagram of a method for performing FI testing in accordance with an embodiment of the invention.

A method for performing FI testing on a DUT such as the DUT 104, in accordance with an embodiment of the invention is described with reference to a process flow diagram of FIG. 5. At block 502, an on-device FI module on the DUT is configured from a host computer connected to the on-device FI module without using a debug port of the DUT. At block 504, testing-related signals is generated by the on-device FI module to execute steps of the FI testing for each fault address being tested by the on-device FI module. In some embodiments, these testing-related signals may include debug signals and/or other signals, such as signals to execute steps 208-220 of the FI testing process illustrated in FIG. 2. At block 506, the testing-related signals transmitted to a processor core on the DUT from the on-device FI module through a debug module on the DUT. At block 508, a report is generated for all the fault addresses tested at the on-device FI module. At block 510, the report is downloaded from the on-device FI module to the host computer for analysis.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It can also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a RAM, a ROM, a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments that use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A device under test comprising:

a debug port designed to receive external protocol-specific debug signals;

a debug transport module connected to the debug port, the debug transport module being operable to translate protocol-specific debug signals into core-specific debug signals;

a debug module connected to the debug transport module to receive the core-specific debug signals;

a processor core operatively connected to the debug module;

an on-device fault injection (FI) module operable to execute FI testing on the processor core through the debug module; and a multiplexer including an output connected to the debug module, the multiplexer further including a first input connected to the debug port and a second input connected to the on-device FI module, the multiplexer being configured to selectively connect one of the debug port and the on-device FI module to the debug module to access the processor core.

2. The device under test of claim 1, wherein the debug transport module is connected between the multiplexer and the debug module to selectively connect one of the debug port and the on-device FI module to the debug transport module to access the processor core.

3. The device under test of claim 2, wherein the on-device FI module is operable to generate internal protocol-specific serial debug signals to be translated into the core-specific debug signals to control the debug module for the FI testing.

4. The device under test of claim 1, wherein the debug transport module is connected between the debug port and the multiplexer to selectively connect the debug transport module or the on-device FI module to the debug module to access the processor core, wherein the multiplexer is controlled by the on-device FI module.

5. The device under test of claim 4, wherein the on-device FI module is operable to generate particular core-specific debug signals to control the debug module for the FI testing.

6. The device under test of claim 1, wherein the on-device FI module is operable to generate testing-related signals to execute steps of the FI testing for each fault address being tested by the on-device FI module.

7. The device under test of claim 6, wherein the on-device FI module is operable to inject a fault when a breakpoint at a fault address is triggered to determine whether a breakpoint is triggered at a positive or negative path address, wherein the positive path address is an address where an execution is supposed to go in case of a fault injection attack and the negative path address is an address wherein the execution is not supposed to go in case of a fault injection attack.

8. The device under test of claim 7, wherein the on-device FI module is operable to compare contents of memory or registers when a breakpoint is triggered at a particular positive path address or for timeouts.

9. A method for performing fault injection (FI) testing on a device under test (DUT), the method comprising:

configuring an on-device FI module on the DUT from a host computer connected to the on-device FI module without using a debug port of the DUT;

generating testing-related signals to execute steps of the FI testing for each fault address being tested by the on-device FI module;

selectively connecting one of the debug port and the on-device FI module to a debug module on the DUT using a multiplexer to access a processor core on the DUT;

transmitting the testing-related signals to a processor core on the DUT from the on-device FI module through the debug module on the DUT;

generating a report for all the fault addresses tested at the on-device FI module; and downloading the report from the on-device FI module to the host computer for analysis.

10. The method of claim 9, wherein the selective connecting includes connecting the on-device FI module to a debug transport module on the DUT through the multiplexer on the DUT to transmit internal protocol-specific serial debug signals generated by the on-device FI module to the debug module for the FI testing.

11. The method of claim 9, wherein the selective connecting includes connecting the on-device FI module to the debug module through the multiplexer to transmit testing-related core-specific debug signals generated by the on-device FI module to control the debug module for the FI testing.

12. The method of claim 9, wherein the transmitting the testing-related signals to the processor core includes injecting a fault when a breakpoint at a fault address is triggered to determine whether a breakpoint is triggered at a positive or negative path address, wherein the positive path address is an address where an execution is supposed to go in case of a fault injection attack and the negative path address is an address wherein the execution is not supposed to go in case of a fault injection attack.

13. The method of claim 12, further comprising comparing contents of memory or registers when a breakpoint is triggered at a particular positive path address or for timeouts.

14. A fault injection (FI) testing system comprising:

a host computer including a debugger and an FI testing manager; and a device under test comprising:

a debug port designed to receive external protocol-specific debug signals managed by the debugger;

a debug transport module connected to the debug port, the debug transport module being operable to translate protocol-specific debug signals into core-specific debug signals;

a debug module connected to the debug transport module to receive the core-specific debug signals;

a processor core operatively connected to the debug module;

an on-device FI module operable to execute FI testing on the processor core through the debug module, the on-device FI module being directly connected to the FI testing manager to receive signals from the FI testing manager; and a multiplexer including an output connected to the debug module, the multiplexer further including a first input connected to the debug port and a second input connected to the on-device FI module, the multiplexer being configured to selectively connect one of the debug port and the on-device FI module to the debug module to access the processor core.

15. The FI testing system of claim 14, wherein the debug transport module is connected between the multiplexer and the debug module to selectively connect one of the debug port and the on-device FI module to the debug transport module to access the processor core.

16. The FI testing system of claim 15, wherein the on-device FI module is operable to generate internal protocol-specific serial debug signals to be translated into the core-specific debug signals to control the debug module for the FI testing.

17. The FI testing system of claim 14, wherein the debug transport module is connected between the debug port and the multiplexer to selectively connect the debugger or the on-device FI module to the debug module to access the processor core, wherein the multiplexer is controlled by the on-device FI module.

18. The FI testing system of claim 17, wherein the on-device FI module is operable to generate particular core-specific debug signals to control the debug module for the FI testing.

19. The FI testing system of claim 14, wherein the on-device FI module is operable to generate testing-related signals to execute steps of the FI testing for each fault address being tested by the on-device FI module.

20. The FI testing system of claim 19, wherein the on-device FI module is operable to inject a fault when a breakpoint at a fault address is triggered to determine whether a breakpoint is triggered at a positive or negative path address, wherein the positive path address is an address where an execution is supposed to go in case of a fault injection attack and the negative path address is an address wherein the execution is not supposed to go in case of a fault injection attack.

* * * * *